(12) United States Patent
Choi et al.

(10) Patent No.: US 11,638,382 B2
(45) Date of Patent: Apr. 25, 2023

(54) METHOD FOR PREPARING ORGANIC ELECTRONIC DEVICE

(71) Applicant: LG CHEM, LTD., Seoul (KR)

(72) Inventors: Kook Hyun Choi, Daejeon (KR); Joon Hyung Kim, Daejeon (KR); Yu Jin Woo, Daejeon (KR); Mi Lim Yu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 460 days.

(21) Appl. No.: 16/467,814

(22) PCT Filed: Dec. 11, 2017

(86) PCT No.: PCT/KR2017/014479
§ 371 (c)(1),
(2) Date: Jun. 7, 2019

(87) PCT Pub. No.: WO2018/106087
PCT Pub. Date: Jun. 14, 2018

(65) Prior Publication Data
US 2019/0334121 A1    Oct. 31, 2019

(30) Foreign Application Priority Data
Dec. 9, 2016 (KR) .......... 10-2016-0167799

(51) Int. Cl.
*G03F 7/028* (2006.01)

(52) U.S. Cl.
CPC .......... *H10K 50/844* (2023.02); *H10K 71/00* (2023.02)

(58) Field of Classification Search
CPC ............ H01L 51/0005; H01L 51/5246; H01L 51/0003; H10K 50/85; H10K 50/8426; H10K 71/135
See application file for complete search history.

(56) References Cited

U.S. PATENT DOCUMENTS

| 7,569,260 | B2 | 8/2009 | Miyazaki et al. | |
|---|---|---|---|---|
| 9,329,426 | B2 | 5/2016 | Kim et al. | |
| 2004/0009303 | A1* | 1/2004 | Ito | H01L 27/3246 313/483 |
| 2005/0176230 | A1* | 8/2005 | Sieber | H01L 51/5088 438/609 |
| 2016/0226031 | A1* | 8/2016 | Jang | C23C 16/45563 |
| 2018/0009775 | A1* | 1/2018 | Tanaka | C07D 311/16 |
| 2018/0197927 | A1* | 7/2018 | Tan | H01L 27/1251 |
| 2019/0372055 | A1* | 12/2019 | Wu | H01L 27/32 |

(Continued)

FOREIGN PATENT DOCUMENTS

| CN | 1459996 A | 12/2003 |
|---|---|---|
| CN | 1839169 A | 9/2006 |
| CN | 100493276 C | 5/2009 |

(Continued)

*Primary Examiner* — Caridad Everhart
(74) *Attorney, Agent, or Firm* — Dentons US LLP (57) ABSTRACT

The present application relates to a method for preparing an organic electronic device, and the organic electronic device prepared by the same, the method for preparing an organic electronic device can improve flatness and adhesion of an organic layer in a process of sealing an organic electronic element to effectively block moisture or oxygen from the outside, thereby securing the lifetime of the organic electronic device.

19 Claims, 1 Drawing Sheet

(56) References Cited

U.S. PATENT DOCUMENTS

2020/0043997 A1* 2/2020 Sonoda .................. H01L 51/56

FOREIGN PATENT DOCUMENTS

| | | |
|---|---|---|
| CN | 105917466 A | 8/2016 |
| JP | 2009047879 A | 3/2003 |
| JP | 2005-044613 A | 2/2005 |
| JP | 2012-094301 A | 5/2012 |
| JP | 2013165023 A | 8/2013 |
| JP | 2014533376 A | 12/2014 |
| KR | 10-0477745 B1 | 3/2005 |
| KR | 10-2006-0057615 A | 5/2006 |
| KR | 10-2007-0105878 A | 10/2007 |
| KR | 10-0812001 B1 | 3/2008 |
| KR | 10-2010-0118682 A | 11/2010 |
| KR | 10-1376319 B1 | 3/2014 |
| KR | 10-2014-0127633 A | 11/2014 |
| KR | 10-2015-0021906 A | 3/2015 |
| KR | 10-2015-0077141 A | 7/2015 |
| TW | 200513472 A | 4/2005 |
| TW | 201311791 A | 3/2013 |
| TW | 201530828 A | 8/2015 |
| WO | 2005019299 A1 | 3/2005 |

\* cited by examiner

METHOD FOR PREPARING ORGANIC ELECTRONIC DEVICE

CROSS-REFERENCE TO RELATED APPLICATIONS

This application is a U.S. National Phase Application of International Application No. PCT/KR2017/014479, filed on Dec. 11, 2017, which claims the benefit of priority based on Korean Patent Application No. 10-2016-0167799 filed on Dec. 9, 2016, the disclosure of which is incorporated herein by reference in its entirety.

TECHNICAL FIELD

The present application relates to a method for preparing an organic electronic device and an organic electronic device prepared using the same.

BACKGROUND ART

An organic electronic device (OED) means a device comprising a layer of an organic material that generates an alternating current of electric charges using holes and electrons, and an example thereof may include a photovoltaic device, a rectifier, a transistor and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides a method for preparing an organic electronic device which can improve flatness and adhesion of an organic layer in a process of sealing an organic electronic element to effectively block moisture or oxygen introduced into an organic electronic device from the outside, thereby securing the lifetime of the organic electronic device.

Technical Solution

The present application relates to a method for preparing an organic electronic device. The preparation method may comprise sealing or encapsulating an organic electronic device such as, for example, an OLED through an encapsulating composition. After the encapsulating composition is applied to the encapsulation, it may be present in an organic layer form sealing the entire surface of the organic electronic element. In this specification, the organic layer, sealing layer and sealing material can be used in the same sense. In addition, the organic layer may be laminated on the organic electronic element together with a protective layer and/or an inorganic layer, which is described below, to form a sealing structure.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transistor and an organic light emitting diode (OLED), and the like, but is not limited thereto. In one example of the present application, the organic electronic device may be an OLED.

The method for preparing an organic electronic device of the present application is a method of forming a printed pattern with an encapsulating composition on a substrate on which an organic electronic element is formed.

Figure 2:
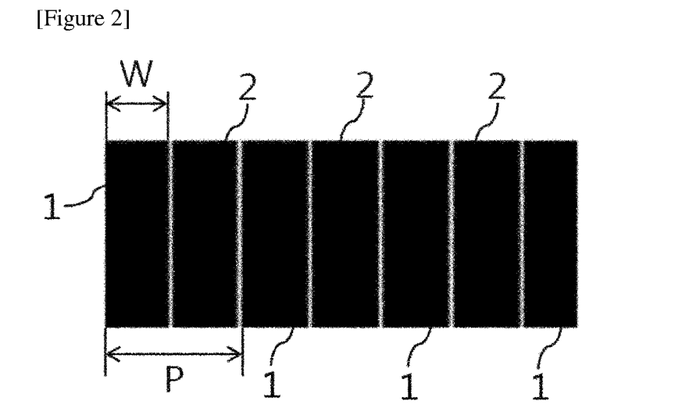
FIG. 2 is a plan view showing a printed pattern according to one example of the present invention.

Specifically, as shown in FIG. 2, the preparation method may comprise steps of: forming two or more primary printed patterns (1) such that they are extended in one direction and have a predetermined pitch (P); and forming secondary printed patterns (2) such that they are extended in one direction and alternately disposed with the primary printed patterns. One direction in the primary printed patterns (1) and one direction in the secondary printed patterns (2) may be in the same direction. The secondary printed pattern (2) may be formed between the primary printed patterns (1) printed so as to be extended in one direction with a predetermined pitch, that is, in an area where the primary pattern (1) is not formed. In the step of forming the primary printed patterns (1), the pitch between the primary printed patterns (1) may be in a range of 10 μm to 300 mm or 3 mm to 250 mm, and the dot pitch of the encapsulating composition present in the printed pattern may be in a range of 10 μm to 650 μm, 20 μm to 590 μm, 30 μm to 480 μm, 40 μm to 370 μm, 50 μm to 390 μm, or 70 μm to 260 μm. The encapsulating composition may be printed by one droplet (forming dots) to form the primary printed patterns (1) in a line, and more specifically, the encapsulating composition printed by one droplet may be spread to form the patterns in a straight line or a rectangular shape extended in one direction, where the shape of the pattern is not particularly limited. By first forming two or more primary printed patterns (1) spaced apart from each other and then performing the step of forming the secondary printed patterns (2), the present application can realize excellent flatness when the encapsulating composition is formed on an organic electronic element by an inkjet method, where such an organic layer also has excellent adhesion with an inorganic layer attached to the upper part, which is described below.

In one example, the primary printed pattern means two or more printed pattern lines spaced apart from each other, and the secondary printed pattern also means two or more printed pattern lines spaced apart from each other.

In one example, the primary printed pattern or the secondary printed pattern may have a width (W) in a range of 2 mm to 150 mm, 3 mm to 130 mm, 5 mm to 100 mm, or 10 mm to 80 mm. In the present application, by controlling the width of the pattern to the above range, it is possible to provide an organic electronic device that an organic layer has excellent flatness upon inkjet printing.

In one example, as described above, the primary printed pattern and the secondary printed pattern may be alternately disposed on the substrate. As described above, since the primary printed patterns have a predetermined pitch, there is an unprinted area between the printed patterns upon the primary printing and a secondary printed pattern is formed in the area excluding the primary printed pattern, whereby the primary and secondary printed lines may be disposed alternately. Through this process, the present application can keep the surface roughness low while forming an organic layer having a thin thickness.

In an embodiment of the present application, the step of forming a printed pattern may proceed with inkjet printing, gravure coating, spin coating, screen printing or reverse offset printing, where the printing method is not particularly limited.

In one example, the step of forming the primary or secondary printed pattern is formed by inkjet printing, where the inkjet printing may have a range of 50 dpi to 1000 dpi or 80 dpi to 800 dpi. That is, the encapsulating composition is used as an ink for inkjet printing so that 50 to 1000 dots per inch can be printed. The present application can precisely print the encapsulating composition on a substrate by controlling the above numerical values.

In one example, the primary printed pattern or the secondary printed pattern may have a thickness of 2 μm to 25 μm, 2.3 μm to 20 μm, 2.8 μm to 15 μm or 3.1 μm to 13 μm. By printing the encapsulating composition to a very thin thickness, in manufacturing an organic electronic device, the present application can minimize the thickness of the organic layer to provide a thin film organic electronic device.

In one example, the preparation method may further comprise a step of planarizing the printed encapsulating composition. The planarizing step may be maintained for 40 to 180 seconds after the primary printed pattern and the secondary printed pattern have been processed. The encapsulating composition applied in a dot form may be filled between the primary printed pattern and the secondary printed pattern due to spreading in the planarizing step.

In an embodiment of the present application, the preparation method may further comprise a step of irradiating the printed encapsulating composition with light. The composition may be irradiated with light to induce curing. The irradiation of light may comprise irradiating with light having a wavelength range of 250 nm to 450 nm or 300 nm to 450 nm region bands at a light quantity of 0.3 to 6 $J/cm^2$ or a light quantity of 0.5 to 5 $J/cm^2$.

In addition, the preparation method of the present application may comprise forming an organic electronic element on a substrate before forming the printed pattern with the encapsulating composition. The formation of the organic electronic element may comprise a step of forming a first electrode layer on a substrate, an organic material layer comprising at least a light emitting layer on the first electrode layer, and a second electrode layer on the organic material layer. Here, the substrate on which the organic electronic element is formed may be produced, for example, by disposing a reflective electrode or a transparent electrode on a substrate such as glass or a polymer film by a method such as vacuum deposition or sputtering and forming an organic material layer on the reflective electrode. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode.

The preparation method of the present application may further comprise a step of forming a protective layer on the first electrode layer, the organic material layer and the second electrode layer, formed on the substrate. The protective layer may be an inorganic protective layer. The protective layer may be a protective layer by chemical vapor deposition (CVD), where as the material, a known inorganic material may be used and for example, silicon nitride (SiNx) may be used. In one example, silicon nitride (SiNx) used as the protective layer can be deposited to a thickness of 0.01 μm to 50 μm.

Furthermore, the preparation method of the present application may further comprise a step of forming an inorganic layer on the organic layer, on which the printed pattern is formed, with the encapsulating composition. The method of forming the inorganic layer may be the same as the above-described method of forming the protective layer.

The material of the inorganic layer is not limited, which may be the same as or different from the above-described protective layer. In addition, the inorganic layer (34) may be formed in the same manner as the protective layer (35). In one example, the inorganic layer may be one or more metal oxides or nitrides selected from the group consisting of Al, Zr, Ti, Hf, Ta, In, Sn, Zn and Si. The inorganic layer may have a thickness of 0.01 μm to 50 μm or 0.1 μm to 20 μm or 1 μm to 10 μm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Ti, Sc, V, Cr, Mn, Fe, Co and Ni, or an oxide of the element, but is not limited thereto.

In an embodiment of the present application, the encapsulating composition may comprise a curable compound. In an embodiment of the present application, the encapsulating composition may be designed to have appropriate physical properties, when the composition has been discharged onto a substrate by using inkjet printing capable of non-contact type patterning. The curable compound may comprise a curable compound having a cyclic structure in its molecular structure and a vinyl ether curable compound. In an embodiment of the present application, the encapsulating composition may comprise a curable compound having a cyclic structure in its molecular structure and a vinyl ether curable compound in amounts of 5 to 50 parts by weight and 25 to 80 parts by weight; 8 to 48 parts by weight and 26 to 75 parts by weight; 13 to 45 parts by weight and 28 to 70 parts by weight or 18 to 43 parts by weight and 29 to 68 parts by weight, respectively. In addition, without being limited to the above, the encapsulating composition of the present application may comprise the curable compound having a cyclic structure in its molecular structure in an amount of 25 to 145 parts by weight, 26 to 140 parts by weight, 27 to 138 parts by weight, 28 to 135 parts by weight or 29 to 134 parts by weight, based on 100 parts by weight of the vinyl ether compound. The term "part by weight" herein may mean a weight ratio between the respective components. The present application controls the content ratio of the vinyl ether-containing curable compound and the curable compound having the cyclic structure, thereby realizing excellent flatness, in particular, in the above-described printed pattern forming process, when the organic layer is formed by the ink jetting process, preventing damage of an organic electronic element even if the liquid composition is directly applied to the element and also providing curing sensitivity and adhesion after curing.

In one example, the vinyl ether curable compound is not particularly limited as long as it has a vinyl ether group. The vinyl ether curable compound may have monofunctionality or more, or bifunctionality or more, and the upper limit is not particularly limited, which may be 10 or less. Also, the compound may have a cyclic structure in its molecular structure, but is not limited thereto, which may be linear or branched. The term bifunctionality or more may mean that two or more vinyl ether groups are present. Furthermore, when the vinyl ether curable compound has a cyclic structure in its molecular structure, it can be distinguished from the curable compound having the cyclic structure described above by the presence or absence of vinyl ether, and accordingly, the curable compound having a cyclic structure described above may not contain the vinyl ether group or an oxetane group described below. When the vinyl ether curable compound has a cyclic structure in its molecular structure, the ring constituting atoms in the molecule may be present in a range of 3 to 10, 4 to 8, or 5 to 7. The cyclic structure may be an alicyclic or aromatic ring, but is not limited thereto. For example, the vinyl ether curable compound may be exemplified by 1,4-cyclohexanedimethanol divinyl ether, butanediol monovinyl ether, triethylene glycol divinyl ether or dodecyl vinyl ether, but is not limited thereto.

In this specification, the curable compound may be collectively referred to as a compound having a curable functional group. The curable compound may comprise, for example, a vinyl ether compound, a curable compound having a cyclic structure in its molecular structure and having at least one or more curable functional groups, a linear or branched aliphatic curable compound, or a curable compound having an oxetane group.

In the present application, the curable functional group of the above-mentioned curable compound may be, for example, one or more selected from a vinyl ether group, an oxetane group, a glycidyl group, an isocyanate group, a hydroxyl group, a carboxyl group, an amide group, an epoxide group, a sulfide group, an acetal group and a lactone group. The curable compound may have one or two or more curable functional groups depending on the type thereof, but is not limited thereto, which may have one curable functional group. The upper limit thereof is not particularly limited, which may be 10 or less.

In one example, the curable compound may comprise a curable compound having a cyclic structure in its molecular structure, as described above. In one example, the compound having a cyclic structure in its molecular structure may have ring constituent atoms in the molecular structure in a range of 3 to 10, 4 to 8, or 5 to 7. The curable compound having a cyclic structure may comprise at least one or more curable functional groups, where the curable functional group may be one or more selected from a glycidyl group, an isocyanate group, a hydroxyl group, a carboxyl group, an amide group, an epoxide group, a sulfide group, an acetal group and a lactone group.

In an embodiment of the present application, the encapsulating composition may further comprise a curable compound having an oxetane group. The curable compound having an oxetane group has bifunctionality or more, which may have at least two oxetane groups, and the upper limit thereof is not particularly limited, which may be 10 or less. By controlling the functional group of the compound having an oxetane group to the above range, the present application can prevent damage to the element due to some un-curing. In addition, the curable compound having an oxetane group may be comprised in an amount of 5 to 90 parts by weight, 8 to 85 parts by weight, 9 to 80 parts by weight, or 10 to 75 parts by weight, relative to 100 parts by weight of the vinyl ether curable compound. By controlling the content of the curable compound having an oxetane group, the present application can form an organic layer on an organic electronic element by an inkjet method and prevent damage to the element, and the applied encapsulating composition can provide an organic layer which has excellent spreadability in a short time and has excellent curing strength after being cured.

The compound having an oxetane group may have a weight average molecular weight in a range of 150 to 1,000 g/mol, 173 to 980 g/mol, 188 to 860 g/mol, 210 to 823 g/mol or 330 to 780 g/mol. By controlling the weight average molecular weight of the compound having an oxetane group to be low, the present application can realize excellent printability when applied to inkjet printing and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time.

The compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, the curable compound may further comprise a linear or branched aliphatic curable compound. The aliphatic curable compound may have at least two or more curable functional groups, and the upper limit may be 10 or less. Also, the aliphatic curable compound may be included in an amount of 5 parts by weight to 37 parts by weight, or 5 parts by weight to 35 parts by weight or 5.3 parts by weight to 33 parts by weight, relative to 100 parts by weight of the entire curable compound. By controlling the content of the aliphatic curable compound, the present application can improve adhesion force on a substrate, on which an organic electronic element is formed, together with excellent optical characteristics, and control the physical properties so that the composition can be applied by the inkjet.

In one example, the curable compound having a cyclic structure may be an epoxy compound, and when the compound is an epoxy compound, the curable compound having a cyclic structure may have an epoxy equivalent in a range of 50 to 350 g/eq, 73 to 332 g/eq, 94 to 318 g/eq or 123 to 298 g/eq. Also, the linear or branched aliphatic compound may have an epoxy equivalent in a range of 120 e/eq to 375 e/eq or 120 e/eq to 250 e/eq. By controlling the epoxy equivalent to be low, the present application can prevent the viscosity of the composition from becoming excessively high to render the inkjet process impossible, while improving the curing completion degree after curing of the sealing material, and simultaneously provide moisture barrier properties and excellent curing sensitivity. In this specification, the epoxy equivalent is grams (g/eq) of a resin containing one gram equivalent of epoxy group, which can be measured according to the method defined in JIS K 7236.

In one example, the encapsulating composition of the present application may have a contact angle to glass of 30° or less, 25° or less, 20° or less, or 12° or less. The lower limit is not particularly limited, but may be 10 or 3° or more. By adjusting the contact angle to 300 or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

In one example, the compound having a cyclic structure in its molecular structure may be exemplified by limonene dioxide, 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In this specification, the curable compound having a cyclic structure may be an aliphatic compound, which may be distinguished from the linear or branched aliphatic compound in that it has a cyclic structure. Also, the curable compound having an oxetane group may be a linear, branched or cyclic aliphatic compound, but it may be distinguished from the two compounds mentioned above in that it has an oxetane group. Furthermore, the vinyl ether curable compound is a compound having a vinyl ether group, which may be distinguished from the above three compounds.

In one example, the structure of the curable compound comprising the oxetane group is not limited as long as it has the functional group, and for example, OXT-221, CHOX, OX-SC, OXT101, OXT121, OXT-211, PNOX-1009 or OXT212 from TOAGOSEI, or EHO, OXBP, OXTP or OXMA from ETERNACOLL may be exemplified. Also, the linear or branched aliphatic curable compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition may further comprise a surfactant. In one example, the surfactant may comprise a polar functional group, and the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-mentioned curable compound to provide excellent coating properties on the organic electronic element. On the other hand, in the case of a surfactant comprising a polar reactive group, it may have high affinity with the other components of the encapsulating composition, thereby realizing an excellent effect in terms of adhesion. In an embodiment of the present application, a hydrophilic fluorine-based surfactant or non-silicone-based surfactant may be used to improve coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in an amount of 0.01 to 10 parts by weight, 0.05 to 10 parts by weight, 0.1 to 10 parts by weight, 0.5 to 8 parts by weight, or 1 to 4 parts by weight, relative to 100 parts by weight of the entire curable compound in the composition. Within the content range, the present application makes it possible that the encapsulating composition is applied to an inkjet method to form an organic layer of a thin film.

In an embodiment of the present application, the encapsulating composition may further comprise a photoinitiator. The photoinitiator may be an ionic photoinitiator. Also, the photoinitiator may be a compound absorbing a wavelength in a range of 180 nm to 400 nm. By using the photoinitiator, the present application can realize excellent curing properties in a specific composition of the present application.

In one example, the photoinitiator may be a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application may comprise a photoinitiator comprising a sulfonium salt as the photoinitiator in the above-mentioned specific composition, so as to be suitable for a use sealing an organic electronic element by an inkjet method. Even if the encapsulating composition according to the above composition is directly sealed on the organic electronic element, it can prevent chemical damage from being applied to the element due to a small amount of generated outgas. Furthermore, the photoinitiator comprising a sulfonium salt may also have excellent solubility, thereby being suitably applied to an inkjet process.

In an embodiment of the present application, the photoinitiator may be present in an amount of 0.1 to 15 parts by weight, 0.2 to 13 parts by weight, or 0.3 to 11 parts by weight, relative to 100 parts by weight of the entire curable compound in the composition. By controlling the photoinitiator content range, due to the nature of the composition that is directly applied on an organic electronic element, the present application can minimize physical and chemical damage to the element.

In an embodiment of the present application, the encapsulating composition may further comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H,11H—Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 to 55 parts by weight, 31 to 52 parts by weight or 32 to 40 parts by weight, relative to 100 parts by weight of the photoinitiator. By controlling the content of the photosensitizer, the present disclosure can realize a synergistic action of curing sensitivity at a desired wavelength, and also prevent the photosensitizer from lowering the adhesive force by not dissolving in the inkjet coating.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent may be included in an amount of 0.1 to 10 parts by weight or 0.5 to 8 parts by weight, relative to 100 parts by weight of the entire curable compound in the composition. Within the above range, the present application can realize an effect of improving the adhesiveness by the addition of the coupling agent.

In addition to the above-mentioned constitutions, the encapsulating composition according to the present application may comprise various additives in the range without affecting the above-described effects of invention. For example, the encapsulating composition may comprise a moisture adsorbent, an inorganic filler, a defoamer, a tackifier, an ultraviolet stabilizer or an antioxidant and the like in an appropriate range of content depending on the desired physical properties.

In one example, the encapsulating composition may be in a liquid phase at room temperature, for example, at about 25° C. In an embodiment of the present application, the encapsulating composition may be in a solventless type liquid phase. The encapsulating composition may be applied to sealing an organic electronic element, and specifically, may be applied to sealing the entire surface of the organic electronic element. As the encapsulating composition has a liquid form at room temperature, the present application can seal the organic electronic element by a method of applying the composition to the side of the element.

Also, the encapsulating composition of the present application may be an ink composition. The encapsulating composition of the present application may be an ink composition capable of an inkjet process. The encapsulating composition of the present application may have a specific composition and physical properties so that ink-jetting can be performed.

Also, in an embodiment of the present application, the encapsulating composition may have a light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application may have a haze of 3% or less, 2% or less or 1% or less according to JIS K7105 standard test after curing, and the lower limit is not particularly limited, but may be 0%. Within the haze range, the encapsulating composition may have excellent optical properties after curing. In this specification, the above-mentioned light transmittance or haze may be measured in a state where the encapsulating composition is cured to an organic layer, and may be optical characteristics measured when the thickness of the organic layer is any one thickness of 2 μm to 50 μm. In an embodiment of the present application, in order to realize the optical characteristics, the above-mentioned moisture adsorbent or inorganic filler may not be included.

Figure 1:
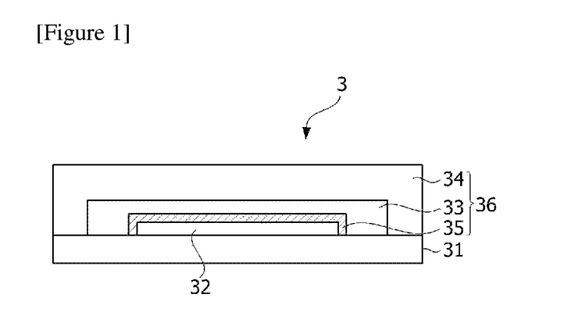
FIGS. 1 and 3 are cross-sectional views showing an organic electronic device according to one example of the present invention.

The present application also relates to an organic electronic device prepared by the above-described preparation method. As shown in FIG. 1, an exemplary organic electronic device (3) may comprise a substrate (31); an organic electronic element (32) formed on the substrate (31); and an organic layer (33) sealing the entire surface of the organic electronic element (32) and comprising the above-described encapsulating composition.

In the present application, the organic layer may be an organic thin film layer, and may form a sealing structure together with an inorganic layer to be described below.

In the present application, the organic electronic element (23) may be an organic light emitting diode.

In one example, the organic electronic device according to the present application may be a top emission type, but is not limited thereto, and may be applied to a bottom emission type.

The organic electronic device may further comprise a protective layer (35) for protecting the electrodes and the light emitting layer of the element. The protective layer (35) may be an inorganic protective layer. The protective layer may be a protective layer by chemical vapor deposition (CVD), where as the material, a known inorganic material may be used and for example, silicon nitride (SiNx) may be used. In one example, silicon nitride (SiNx) used as the protective layer can be deposited to a thickness of 0.01 μm to 5 μm.

In an embodiment of the present application, the organic electronic device (3) may further comprise an inorganic layer (34) formed on the organic layer (33). The material of the inorganic layer (34) is not limited, which may be the same as or different from the above-described protective layer. In one example, the inorganic layer may be one or more metal oxides or nitrides selected from the group consisting of Al, Zr, Ti, Hf, Ta, In, Sn, Zn and Si. The inorganic layer may have a thickness of 5 to 100 nm, 10 nm to 90 nm, or 10 to 80 nm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the organic layer may have a thickness in a range of 2 μm to 20 μm, 2.5 μm to 15 μm, and 2.8 μm to 9 μm. The present application may provide a thin-film organic electronic device by providing a thin organic layer.

The organic electronic device (3) of the present application may comprise a sealing structure comprising the organic layer (33) and the inorganic layer (34), as described above, where the sealing structure may comprise at least one or more organic layers and at least one or more inorganic layers, and the organic layer and the inorganic layer may be repeatedly laminated. For example, the organic electronic device may have a structure of substrate/organic electronic element/protective layer/(organic layer/inorganic layer)n, where n may be a number in a range of 1 to 100. FIG. 1 is a cross-sectional view exemplarily showing a case where n is 1.

In one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Figure 3:
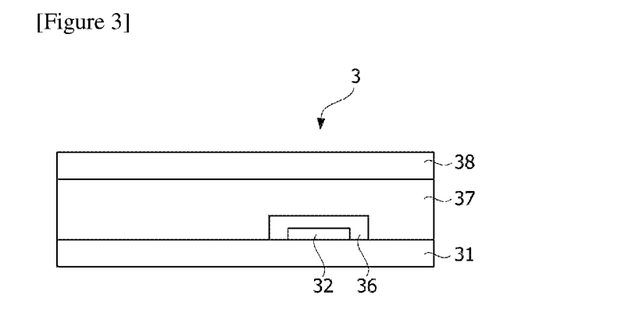

Also, as shown in FIG. 3, the organic electronic device (3) may further comprise a encapsulation film (37) existing between the cover substrate (38) and the substrate (31) on which the organic electronic element (32) is formed. The encapsulation film (37) may be applied as a use for attaching the substrate (31) on which the organic electronic element (32) is formed and the cover substrate (38), which may be, for example, a pressure-sensitive adhesive film or an adhesive film, but is not limited thereto. The encapsulation film (37) may seal the entire surface of the sealing structure (36) of the above-described organic layer and inorganic layer, laminated on the organic electronic element (32).

Advantageous Effects

The present application provides a method for preparing an organic electronic device which can improve flatness and adhesion of an organic layer in a process of sealing an organic electronic element to effectively block moisture or oxygen introduced into an organic electronic device from the outside, thereby securing the lifetime of the organic electronic device.

EXPLANATION OF REFERENCE NUMERALS

3: organic electronic device
31: substrate
32: organic electronic element
33: organic layer
34: inorganic layer
35: protective layer
36: sealing structure 37: encapsulation film
38: cover substrate

BEST MODE

Hereinafter, the present disclosure will be described in more detail through Examples according to the present disclosure and Comparative Examples not complying with the present disclosure, but the scope of the present disclosure is not limited by the following examples.

Hereinafter, in Examples and Comparative Examples, an alicyclic epoxy compound Celloxide 2021P from Daicel (hereinafter, CEL2021P) and limonene dioxide (LDO) were used as curable compounds having a cyclic structure. As a vinyl ether curable compound, 1,4-cyclohexanedimethanol divinyl ether (CHDVE) was used. As an oxetane group-containing curable compound, OXT-221 from TOAGOSEI was used. Furthermore, TTA UV-694 (hereinafter, UV694) of an iodonium salt photoinitiator from Tetrachem, was used as a photoinitiator, and F430 from DIC of a fluorine-based surfactant was used as a surfactant. In addition, a silane coupling agent (KBM-403) was used as a coupling agent, and 2-isopropylthioxanthone (ITX) was used as a photosensitizer. Also, 2,6-di-tert-butyl-p-cresol (BHT from SIGMA Aldrich) was used as a heat stabilizer.

Examples 1 to 4

The above compositions were each formulated in weight ratios as in Table 1 below, and introduced into a mixing vessel.

In the mixing vessel, uniform encapsulating composition inks were prepared using a planetary mixer (Kurabo, KK-250s).

Two or more primary printed patterns were formed with each of the encapsulating compositions as prepared above under conditions of Table 2 below using Unijet UJ-200 (Inkjet head-Dimatix 10Pl 256), and then the secondary printed patterns were subjected to ink-jetting between the primary patterns and the primary patterns to form an organic layer.

Comparative Examples 1 to 4

The above compositions were each formulated in weight ratios as in Table 1 below, and introduced into a mixing vessel.

In the mixing vessel, uniform encapsulating composition inks were prepared using a planetary mixer (Kurabo, KK-250s).

The printing was performed only primarily to form an organic layer over the entire area of the substrate. The organic layer was formed in the same manner as in Example 1, except that ink-jetting was performed under conditions of Table 2 below.

TABLE 1

|  | Example | | | | Comparative Example | | | |
| --- | --- | --- | --- | --- | --- | --- | --- | --- |
|  | 1 | 2 | 3 | 4 | 1 | 2 | 3 | 4 |
| LDO | 10 | 10 | 10 | 10 | 10 | 10 | 10 | 10 |
| CEL2021P | 10 | 10 | 10 | 10 | 10 | 10 | 10 | 10 |
| CHDVE | 55 | 55 | 55 | 55 | 55 | 55 | 55 | 55 |
| OXT-221 | 17 | 17 | 17 | 17 | 17 | 17 | 17 | 17 |
| UV694 | 1 | 1 | 1 | 1 | 1 | 1 | 1 | 1 |
| F430 | 1 | 1 | 1 | 1 | 1 | 1 | 1 | 1 |

TABLE 1-continued

|  | Example | | | | Comparative Example | | | |
| --- | --- | --- | --- | --- | --- | --- | --- | --- |
|  | 1 | 2 | 3 | 4 | 1 | 2 | 3 | 4 |
| KBM-403 | 5 | 5 | 5 | 5 | 5 | 5 | 5 | 5 |
| ITX | 0.5 | 0.5 | 0.5 | 0.5 | 0.5 | 0.5 | 0.5 | 0.5 |
| BHT | 0.5 | 0.5 | 0.5 | 0.5 | 0.5 | 0.5 | 0.5 | 0.5 |

Physical properties in Examples and Comparative Examples were evaluated in the following manner.

1. Surface Roughness Measurement

The organic layers formed in Examples and Comparative Examples were UV cured with a light quantity of 4000 mJ/cm$^2$ at an intensity of 1000 mW/cm$^2$. The Ra values were measured using an Alpha step (KLA-Tencor) instrument, where it can be evaluated to be excellent in the case of 10 nm or less.

TABLE 2

|  | Number of prints | DPI | Planarization | Thickness (μm) | Roughness (Ra, nm) |
| --- | --- | --- | --- | --- | --- |
| Example 1 | 2 | 150/150 | 60 sec | 3.2 | 7.7 |
| Example 2 | 2 | 200/200 | 60 sec | 5.1 | 4.3 |
| Example 3 | 2 | 300/300 | 60 sec | 8.0 | 3.8 |
| Example 4 | 2 | 400/400 | 60 sec | 10.1 | 3.4 |
| Comparative Example 1 | 1 | 300 | 60 sec | 3.1 | 50.3 |
| Comparative Example 2 | 1 | 400 | 60 sec | 5.0 | 45.3 |
| Comparative Example 3 | 1 | 600 | 60 sec | 8.2 | 32.3 |
| Comparative Example 4 | 1 | 800 | 60 sec | 10.2 | 27.6 |

In the case of DPI, Example 1 to 4 showed DPIs of the primary printed pattern and the secondary printed pattern, respectively, and Comparative Examples 1 to 4 showed single DPI values, as only the primary printing was performed. The thickness was measured as an average thickness of the formed organic layers. The planarization means a retention time for planarization after ink-jetting.

The invention claimed is:

1. A method for preparing an organic electronic device in which printed patterns of an encapsulating composition are formed on a substrate on which an organic electronic element is formed, the method comprising:
    forming two or more primary printed patterns of the encapsulating composition such that they are extended in one direction, spaced apart from each other, and have a predetermined pitch; and
    forming two or more secondary printed patterns of the encapsulating composition such that they are extended in the one direction, spaced apart from each other, and alternately disposed with the primary printed patterns,
    wherein the primary printed patterns and the secondary printed patterns of the encapsulating composition are formed on the organic electronic element.

2. The method for preparing an organic electronic device according to claim 1, wherein each of the primary printed patterns or the secondary printed patterns has a width in a range of 2 to 150 mm.

3. The method for preparing an organic electronic device according to claim 1, wherein the step of forming the primary or the step of forming the secondary printed patterns proceeds with inkjet printing, gravure coating, spin coating, screen printing or reverse offset coating.

4. The method for preparing an organic electronic device according to claim 1, wherein the primary or secondary printed patterns are formed by inkjet printing and the inkjet printing has a printing resolution range of 50 dpi to 1000 dpi.

5. The method for preparing an organic electronic device according to claim 1, wherein each of the primary printed patterns or the secondary printed patterns has a thickness of 2 to 25 μm.

6. The method for preparing an organic electronic device according to claim 1, further comprising a step of planarizing the encapsulating composition.

7. The method for preparing an organic electronic device according to claim 1, further comprising a step of irradiating the encapsulating composition with light to form the cured encapsulating composition.

8. The method for preparing an organic electronic device according to claim 1, further comprising a step of forming the organic electronic element by forming a first electrode layer on the substrate, an organic material layer comprising at least a light emitting layer on the first electrode layer, and a second electrode layer on the organic material layer, before forming the printed pattern with the encapsulating composition.

9. The method for preparing an organic electronic device according to claim 8, further comprising a step of forming a protective layer on the second electrode layer.

10. The method for preparing an organic electronic device according to claim 7, further comprising a step of forming an inorganic layer on the cured encapsulating composition.

11. The method for preparing an organic electronic device according to claim 1, wherein the encapsulating composition comprises a curable compound.

12. The method for preparing an organic electronic device according to claim 11, wherein the curable compound comprises at least one or more curable functional groups.

13. The method for preparing an organic electronic device according to claim 11, wherein the curable compound comprises 5 to 50 parts by weight of a curable compound having a cyclic structure in its molecular structure and 25 to 80 parts by weight of a vinyl ether curable compound.

14. The method for preparing an organic electronic device according to claim 13, wherein the curable compound further comprises a curable compound having an oxetane group.

15. The method for preparing an organic electronic device according to claim 14, wherein the curable compound having an oxetane group is comprised in an amount of 5 to 90 parts by weight relative to 100 parts by weight of the vinyl ether curable compound.

16. The method for preparing an organic electronic device according to claim 11, wherein the composition further comprises a surfactant.

17. The method for preparing an organic electronic device according to claim 11, wherein the composition further comprises a photoinitiator.

18. The method for preparing an organic electronic device according to claim 11, wherein the composition further comprises a photosensitizer.

19. An organic electronic device prepared by the method for preparing an organic electronic device according to claim 1.

* * * * *